United States Patent
Jin

(10) Patent No.: US 10,162,440 B2
(45) Date of Patent: Dec. 25, 2018

(54) ARRAY SUBSTRATE, TOUCH DISPLAY APPARATUS AND TEST METHOD THEREOF

(71) Applicants: Shanghai AVIC OPTO Electronics Co., Ltd., Shanghai (CN); TIANMA MICRO-ELECTRONICS CO., LTD., Shenzhen (CN)

(72) Inventor: Huijun Jin, Shanghai (CN)

(73) Assignees: Shanghai Avic OPTO Electronics Co., Ltd., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 270 days.

(21) Appl. No.: 15/067,200

(22) Filed: Mar. 11, 2016

(65) Prior Publication Data
US 2016/0328062 A1 Nov. 10, 2016

(30) Foreign Application Priority Data
May 8, 2015 (CN) .......................... 2015 1 0233019

(51) Int. Cl.
*H01L 27/32* (2006.01)
*G06F 3/041* (2006.01)
(Continued)

(52) U.S. Cl.
CPC .......... *G06F 3/0412* (2013.01); *G02F 1/1309* (2013.01); *G02F 1/1345* (2013.01);
(Continued)

(58) Field of Classification Search
CPC .................................................... H01L 27/323
(Continued)

(56) References Cited

U.S. PATENT DOCUMENTS 8,988,627 B2 3/2015 Tae et al.
9,240,361 B2 * 1/2016 Zhang .................. H01L 27/124
(Continued)

FOREIGN PATENT DOCUMENTS

CN 101216648 A 7/2008
CN 101231439 A 7/2008
(Continued)

OTHER PUBLICATIONS

The 1st Office Action dated May 9, 2017 regarding the Chinese priority patent application (APPL. No. 201510233019.5).

*Primary Examiner* — Chandra Chaudhari
(74) *Attorney, Agent, or Firm* — Kilpatrick Townsend & Stockton LLP

(57) ABSTRACT

An array substrate, a touch display apparatus and a test method thereof are provided. The array substrate can include a substrate, a common electrode structure and a conductive structure for testing. The common electrode structure and conductive structure can be arranged on a same side of the substrate. The common electrode structure can be insulated from the conductive structure for testing. There can be an overlapping area between a projection of the common electrode structure and a projection of the conductive structure for testing in a direction perpendicular to the substrate. Laser melting may be performed on the overlapping area to electrically connect the common electrode structure to the conductive structure for testing.

19 Claims, 6 Drawing Sheets

(51) Int. Cl.
 *G02F 1/13* (2006.01)
 *G02F 1/1333* (2006.01)
 *G06F 3/044* (2006.01)
 *G09G 3/00* (2006.01)
 *G02F 1/1345* (2006.01)
 G09G 3/36 (2006.01)

(52) U.S. Cl.
 CPC .......... *G02F 1/13338* (2013.01); *G06F 3/044* (2013.01); *G06F 3/0416* (2013.01); *G09G 3/006* (2013.01); *G09G 3/3655* (2013.01); *G09G 2300/0426* (2013.01); *H01L 27/323* (2013.01)

(58) Field of Classification Search
 USPC .......................................................... 257/59
 See application file for complete search history.

(56) References Cited

U.S. PATENT DOCUMENTS

| | | |
|---|---|---|
| 2008/0170195 A1 | 7/2008 | Kwon et al. |
| 2013/0215354 A1 | 8/2013 | Yoon et al. |
| 2013/0257794 A1 | 10/2013 | Lee et al. |

FOREIGN PATENT DOCUMENTS

| | | |
|---|---|---|
| CN | 201145800 Y | 11/2008 |
| CN | 102708771 A | 10/2012 |
| CN | 102998869 A | 3/2013 |
| CN | 103364983 A | 10/2013 |

\* cited by examiner ic # ARRAY SUBSTRATE, TOUCH DISPLAY APPARATUS AND TEST METHOD THEREOF

CROSS REFERENCE TO RELATED APPLICATIONS

The present application claims the priority of Chinese Patent Application No. 201510233019.5, titled "ARRAY SUBSTRATE, TOUCH DISPLAY APPARATUS AND TEST METHOD THEREOF", filed on May 8, 2015 with the State Intellectual Property Office of People's Republic of China, which is incorporated herein by reference in its entirety.

TECHNICAL FIELD

The disclosure relates to the field of display technology, and in particular, to an array substrate, a touch display apparatus and a test method thereof.

BACKGROUND

Presently, it is a most simple, convenient and natural way to use a touch screen, as an input medium, to perform human-machine interaction. Integration of touch function on a liquid crystal display (LCD) or an organic light-emitting diode (OLED) has become a research focus for more and more manufacturers of flat panel displays.

In order to further reduce the size of the touch screen and thus reduce the size of a mobile terminal with the touch screen, in recent years an in cell touch panel (TP) is developed in the field of display, and a touch electrode is integrated inside a liquid crystal display panel for the in cell TP. Therefore, the touch screen using in cell display technique is smaller than the touch screen using one glass solution (OGS) technique.

In the conventional in cell TP, a common electrode in a pixel area doubles as a touch electrode, which can reduce the size of the in cell TP. The common electrode doubling as the touch electrode is arranged below an insulation layer due to the limitation of the structure of film layers, therefore, it is extremely difficult to test the potential of the common electrode in the parsing process. It is hard to use an oscilloscope probe or a probe of a flat panel display (FDP) manual prober to pierce the insulation layer, especially in the case that a pixel electrode is located above the common electrode. In placing the probe it is likely to cause contact between the probe and the pixel electrode, and if the pixel electrode is pierced by using brutal force, it is likely to short-circuit the pixel electrode to the common electrode, thereby affecting a test result.

Therefore, there is a need to provide an array substrate, a touch display apparatus and a test method for the touch display apparatus to reduce the difficulty of testing the potential of the common electrode and improve the accuracy of the test result.

SUMMARY

An array substrate, a touch display apparatus and a test method thereof are provided according to the disclosure, to reduce the difficulty of testing a potential of a common electrode and improve the accuracy of a test result.

In order to address the above problems, an array substrate is provided according to the disclosure. The array substrate can include a substrate, a common electrode structure and a conductive structure for testing. The common electrode structure and conductive structure can be arranged on a same side of the substrate. The common electrode structure can be insulated from the conductive structure for testing. There can be an overlapping area between a projection of the common electrode structure and a projection of the conductive structure for testing in a direction perpendicular to the substrate. Laser melting may be performed on the overlapping area to electrically connect the common electrode structure to the conductive structure for testing.

A touch display apparatus is provided according to the disclosure. The touch display apparatus can include the array substrate described above, a color filter arranged opposite to the array substrate; and a liquid crystal layer arranged between the array substrate and the color filter.

In the case that a potential of the common electrode needs to be tested, the laser melting may be performed on the overlapping area to electrically connect the common electrode structure to the conductive structure for testing, and the probe is placed onto the conductive structure for testing. Therefore, the difficulty of testing the potential of the common electrode can be reduced, and the probe is not likely to contact other components around the common electrode structure, thereby improving the accuracy of the test result. In the case that the touch display apparatus operates normally, the common electrode structure is insulated from the conductive structure for testing, and thus the potential of the common electrode structure is not susceptible to the conductive structure for testing.

A test method for a touch display apparatus is further provided according to the disclosure. The method can include providing a touch display apparatus, where the touch display apparatus can include the array substrate according to the disclosure; performing laser melting on the overlapping area, to electrically connect the common electrode structure to the conductive structure for testing; and testing the potential of the conductive structure for testing to obtain the potential of the common electrode structure.

In the case that the potential of the common electrode is tested with the test method for the touch display apparatus according to the disclosure, the probe may be placed onto the conductive structure for testing. Therefore, the difficulty of testing the potential of the common electrode is reduced, and the probe is not likely to contact components around the common electrode structure, thereby improving the accuracy of the test result.

DETAILED DESCRIPTION OF THE EMBODIMENTS

Figure 1:
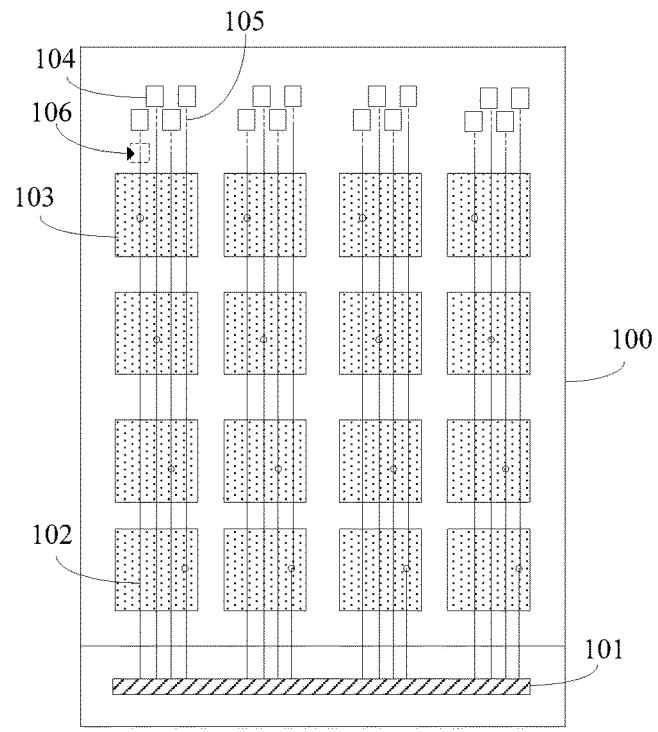
FIG. 1 is a schematic diagram of an array substrate according to the disclosure.

As described in the background section, in the conventional touch display apparatus, the common electrode in the pixel area doubles as the touch electrode, which can reduce the size of the touch display apparatus. The common electrode doubling as the touch electrode is arranged below an insulation layer due to the limitation of the structure of film layers, therefore, it is extremely difficult to test the potential of the common electrode in the parsing process. It is hard to use an oscilloscope probe or a probe of a FDP manual prober to pierce the insulation layer, especially in the case that a pixel electrode is located above the common electrode. In placing the probe it is likely to cause the probe to contact the pixel electrode, and if the pixel electrode is pierced by using brutal force, it is likely to short-circuit the pixel electrode to the common electrode thereby affecting a test result.

Moreover, if the common electrode is connected directly to a test terminal arranged on a surface of the touch display apparatus, the test terminal may cause large noise for the common electrode when the touch display apparatus operates, thereby affecting the touch sensing accuracy of the touch display apparatus.

In order to address the above problems, an array substrate is provided according to the disclosure. The array substrate can include a substrate, a common electrode structure and a conductive structure for testing. The common electrode structure and conductive structure can be arranged on a same side of the substrate. The common electrode structure can be insulated from the conductive structure for testing. There can be an overlapping area between a projection of the common electrode structure and a projection of the conductive structure for testing in a direction perpendicular to the substrate. Laser melting may be performed on the overlapping area to electrically connect the common electrode structure to the conductive structure for testing.

The array substrate may be applied to a display apparatus. In the case that the potential of the common electrode needs to be tested, the laser melting may be performed on the overlapping area to electrically connect the common electrode structure to the conductive structure for testing, and a probe is placed onto the conductive structure for testing. Therefore, the difficulty of testing the potential of the common electrode is reduced, and the probe is not likely to contact other components around the common electrode structure, thereby improving the accuracy of the test result. In the case that the display apparatus operates normally, the common electrode structure is insulated from the conductive structure for testing, and thus the potential of the common electrode structure is not susceptible to the conductive structure for testing.

To make the above objects, features and advantages of the disclosure more apparent and easy to be understood, embodiments of the disclosure are illustrated in details in conjunction with the drawings hereinafter.

FIG. 1 illustrates a schematic diagram of an array substrate according to a first embodiment of the disclosure. The array substrate according to the first embodiment can include a substrate 100, a common electrode structure and a conductive structure for testing The common electrode structure and conductive structure can be arranged on a same side of the substrate 100.

In the embodiment, the substrate 100 is a glass substrate. However, this is not intended to be limiting. It should be understood the material of the substrate 100 is not limited in the disclosure.

The common electrode structure and the conductive structure for testing can be both made of conductive material, and the common electrode structure can be insulated from the conductive structure for testing. In the embodiment, the common electrode structure can include one or more common electrodes 103 and one or more common electrode lines 102 connected thereto, the conductive structure for testing can include one or more test pads 104 and one or more test leads 105 connected thereto. The test pad 104 can be configured to place a test probe for testing the potential of the common electrode structure. The test lead 105 can be insulated from the common electrode line 102. There can be an overlapping region between a projection of the test lead 105 and a projection of the common electrode line 102 in a direction perpendicular to the substrate 100.

As shown in FIG. 1, in this embodiment, the array substrate is applied to a touch display apparatus, the common electrode 103 is configured to input a common signal in a display period of the touch display apparatus, and input or output a touch signal in a touch period of the touch display apparatus.

In the case that a probe is needed for testing the potential of the common electrode 103, laser melting may be performed on the overlapping area 106 to electrically connect the test lead 105 to the common electrode line 102, thereby electrically connecting the common electrode structure to the conductive structure for testing. The probe is placed onto the test pad 104. Therefore, the difficulty of testing the potential of the common electrode 103 can be reduced, and the probe is not likely to contact components around the common electrode structure, thereby improving the accuracy of the test result. In the case that the touch display apparatus operates normally, the common electrode structure can be insulated from the conductive structure for testing, and thus the potential of the common electrode structure is not susceptible to the conductive structure for testing. Especially, in the case that the test pad 104 is arranged on the surface of the touch display apparatus, the potential of the common electrode 103 is not affected even if the test pad 104 is touched by a finger.

Figure 2:
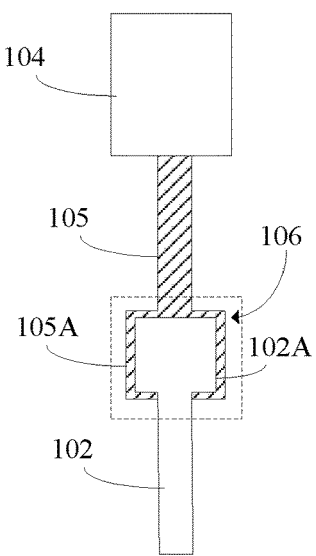
FIG. 2 is an enlarged view for an overlapping area and a peripheral region thereof in the array substrate shown in FIG. 1.

FIG. 2 illustrates an enlarged view for an overlapping area 106 and a peripheral region thereof in the array substrate shown in FIG. 1. In the embodiment, the test lead 105 includes a first extension portion 105A; the common electrode line 102 includes a second extension portion 102A; the first extension portion 105A is arranged opposite to the second extension portion 102A; and there is the overlapping area 106 between a projection of the first extension portion 105A of the test lead 105 and a projection of the second extension portion 102A of the common electrode line 102 in the direction perpendicular to the substrate 100.

As shown in FIG. 1, in conjunction with FIG. 2, in the embodiment, the common electrode structure includes multiple common electrodes 103 and multiple common electrode lines 102. In the embodiment, each of the common electrodes 103 is electrically connected to a respective common electrode line 102, and the common electrodes 103 can be configured to input common signals in a display period of the touch display apparatus, and input or output touch signals in a touch period of the touch display apparatus.

The conductive structure for testing can include multiple test leads 105 and multiple test pads 104, and there is the overlapping area 106 between the projection of the first extension portion 105A of each of the test leads 105 and the projection of the second extension portion 102A of a respective common electrode line 102 in the direction perpendicular to the substrate 100.

It should be noted that, FIG. 2 only illustrates a position relationship between the first extension portion 105A and the second extension portion 102A in the direction parallel to the substrate 100, and an upper and lower relationship between the first extension portion 105A and the second extension portion 102A in the direction perpendicular to the substrate 100 is not defined. When the laser melting is performed on the overlapping area 106, the first extension portion 105A and the second extension portion 102A are melt by the laser melting, a second insulation layer 112 and a third insulation layer 113 between the first extension portion 105A and the second extension portion 102A are burned through, a connection structure running through the second insulation layer 112 and the third insulation layer 113 is formed between the first extension portion 105A and the second extension portion 102A, to electrically connect the first extension portion 105A to the second extension portion 102A. It should be noted that, in the embodiment, the test lead 105 and the common electrode line 102 are made of metal. That is, the first extension portion 105A and the second extension portion 102A can made of metal. The advantage of using metal lies in that the connection structure is easy to be formed between the first extension portion 105A and the second extension portion 102A to electrically connect the first extension portion 105A to the second extension portion 102A when the laser melting is performed on the overlapping area 106. It should be understood that the materials of the test lead 105 and the common electrode line 102 are not limited in the disclosure, and the test lead 105 and the common electrode line 102 may be made of other conductive material such as metal oxide in another embodiment.

The arrangement that the overlapping region 106 is formed between the first extension portion 105A and the second extension portion 102A has the following benefits. Generally the test lead 105 and the common electrode line 102 have small widths, if an overlapping area is directly formed between the projection of the test lead 105 and the projection of the common electrode line 102 in the direction perpendicular to the substrate 100, the overlapping area has a small area, laser lights may arrive at other components around the test lead 105 and the common electrode line 102 when the laser melting is performed on the small overlapping area, thereby affecting the quality of the array substrate. In the embodiment, the first extension portion 105A and the second extension portion 102A are arranged specially to form the overlapping area 106, and the first extension portion 105A and the second extension portion 102A have widths greater than those of the test lead 105 and the common electrode line 102 which can effectively prevent the laser lights from arriving at other components around the first extension portion 105A or the second extension portion 102A, and ensure the quality of the array substrate, thereby ensuring the performance of the touch display apparatus. When the laser melting is performed on the first extension portion 105A and the second extension portion 102A, the connection structure formed between the first extension portion 105A and the second extension portion 102A can have a better quality, and thus the electric connection between the test pad 104 and the common electrode 103 can have a better connection performance. This is due partially to that the first extension portion 105A and the second extension portion 102A have a high proportion of conductive material, through the laser melting, compared with the laser melting directly performed on the thin test lead 105 and the thin common electrode line 102.

In the embodiment, the first extension portion 105A is arranged on an end of the test lead 105, and the second extension portion 102A is arranged on an end of the common electrode line 102. This arrangement is not intended to be limiting. In another embodiment, the first extension portion 105A may be arranged in the middle of the test lead 105, and the second extension portion 102A may be arranged in the middle of the common electrode line 102.

The first extension portion 105A has the same shape as the second extension portion 102A, and the first extension portion 105A and the second extension portion 102A may have a shape of a rectangle, a polygon or a circle.

In the embodiment, the first extension portion 105A and the second extension portion 102A are rectangle-shaped, for the convenience of design. The widths of the first extension portion 105A and the second extension portion 102A are both greater than 10 micrometers, so that the laser lights are not likely to arrive at other components around the first extension portion 105A or the second extension portion 102A when the laser melting is performed, and the electric connection between the test pad 104 and the common electrode 103 has an improved performance. It should be noted that, the first extension portion 105A is slightly larger than the second extension portion 102A as shown in FIG. 2, but the scales and the sizes of the first extension portion 105A and the size of the second extension portion 102A are not intended to be limiting in the disclosure. In another embodiment, the projection of the first extension portion 105A may partially overlap the projection of the second extension portion 102A in the direction perpendicular to the substrate 100, and the partially overlapping region is the overlapping area.

It should be noted that, the array substrate includes a display region (not marked), the common electrode is located in the display region and the overlapping area 106 is located on the periphery of the display region, benefits of which lie in that the display region is not likely to be damaged when the laser melting is performed on the overlapping area 106, thereby ensuring quality of images displayed on the touch display apparatus.

As shown in FIG. 1, in the embodiment, a touch display chip 101 is arranged on a side of the display region of the array substrate, the multiple common electrode lines 102 are all connected to the touch display chip 101, and common signals or touch signals are input by the touch display chip 101 to the common electrodes 103. The overlapping area 106 is located on the array substrate on a side farther away from the touch display chip 101. The specific position of the overlapping area 106 on the periphery of the display region is not limited in the disclosure.

It should further be noted that, the conductive structure for testing includes multiple test pads 104, and each of the test leads 105 is electrically connected to a respective test lead 104 in the embodiment.

Figure 3:
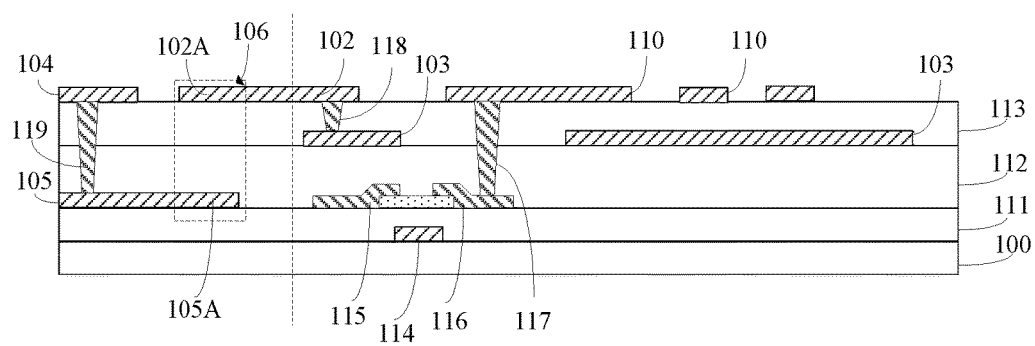
FIG. 3 is a sectional view of a region of the array substrate shown in FIG. 1.

FIG. 3 illustrates a sectional view of a region of the array substrate shown in FIG. 1. As shown in FIG. 3, a sectional view of a region around the overlapping area 106 is shown on the left side of a dotted line, and a sectional view of a region around the common electrode 103 in the display region is shown on the right side of the dotted line. As shown in FIG. 3, the array substrate according to the disclosure can include a gate 114 located on the substrate 100; a first insulation layer 111 covering the gate 114; a source 115 and a drain 116 located on a side of the first insulation layer 111 farther away from the substrate 100; a second insulation layer 112 covering the source 115 and the drain 116, where the common electrode 103 is located on a side of the second insulation layer 112 farther away from the substrate 100; a third insulation layer 113 covering the common electrode 103; a pixel electrode 110 located on a side of the third insulation layer 113 farther away from the substrate 100; and a first via hole 117 arranged in the second insulation layer 112 and the third insulation layer 113, where the pixel electrode 110 is electrically connected to the drain 116 through the first via hole 117. A transistor is composed of the gate 114, the source 115 and the drain 116, and the transistor is configured to control a switch for applying a potential on the pixel electrode 110.

In the embodiment, the common electrode line 102 is located in the same layer with the pixel electrode 110, the array substrate further includes a second via hole 118 located in the third insulation layer 113, and the common electrode 103 is electrically connected to the common electrode line 102 through the second via hole 118.

The test lead 105 is located in the same layer with the source 115 and the drain 116, the test pad 104 is located on the side of the third insulation layer 113 farther away from the substrate 100, the array substrate further includes a fourth via hole 119 located in the second insulation layer 112 and the third insulation layer 113, and the test pad 104 is electrically connected to the test lead 105 through the fourth via hole 119. There is the overlapping area 106 between the projection of the first extension portion 105A of the test lead 105 and the projection of the second extension portion 102A of the common electrode line 102 in the direction perpendicular to the substrate 100. It should be noted that, in the embodiment, the first extension portion 105A is located in the same layer with the test lead 105, and the second extension portion 102A is located in the same layer with the common electrode line 102, which are not limited in the disclosure. In another embodiment, the first extension portion 105A may be located in a different layer from the test lead 105, and the second extension portion 102A may be located in a different layer from the common electrode line 102, as long as the first extension portion 105A is located in a different layer from the second extension portion 102A and the projection of the first extension portion 105A overlaps the projection of the second extension portion 102A in the direction perpendicular to the substrate 100.

In the embodiment, a surface of the test pad 104 is exposed above a surface of the array substrate, benefits of which lie in that the probe may be placed directly onto the surface of the test pad 104 in testing the potential of the common electrode 103. Compared with the conventional technology, in which the probe is placed directly onto the common electrode arranged inside the insulation layer, the damage on the pixel electrode and the insulation layer is avoided effectively, thereby reducing the probability that the pixel electrode is short-circuited to the common electrode.

In the embodiment, the test pad 104 is rectangle-shaped, and the test pad 104 has a length and a width which are both greater than 20 micrometers, so that it is easy for the probe to have a contact with the test pad 104 and unlikely to touch other test pads 104 when the probe is placed onto the test pad 104.

In the embodiment, the test pad 104 is made of metal, but this is not intended to be limiting. In another embodiment, the test pad 104 is made of metal oxide such as Indium Tin oxide.

It should be noted that, in another embodiment, the test lead 105 may be arranged in other layer, for example, the test lead 105 is arranged in the same layer with the gate 114.

In practice, as shown in FIG. 3, the array substrate in the embodiment is a fringe field switching (FFS) mode array substrate with a mid-com structure. This is not intended to be limiting. In another embodiment, the array substrate may be an FFS mode array substrate with a top-com structure (that is, the common electrode is arranged above the pixel electrode), an in-plane switch (IPS) mode array substrate or a twisted nematic (TN) mode array substrate, as long as the common electrode structure is insulated from the conductive structure for testing and there is an overlapping area between a projection of a portion (such as the first extension portion 105A) of the conductive structure for testing and a projection of a portion (such as the second extension portion 102A) of the common electrode structure in a direction perpendicular to the substrate 100. The test lead 105 is electrically connected to the common electrode line 102 by means of the laser melting in testing the potential of the common electrode 103.

Figure 4:
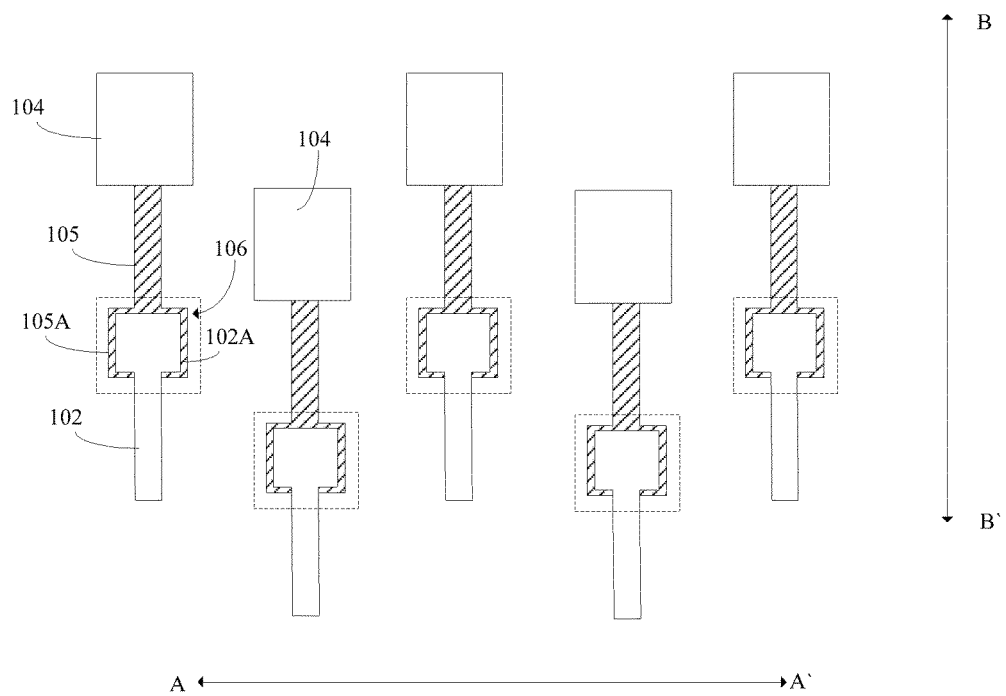
FIG. 4 is a distribution map of overlapping areas in the array substrate shown in FIG. 1.

FIG. 4 illustrates a distribution map of overlapping areas 106 in the array substrate shown in FIG. 1. In the embodiment, the multiple test pads 104 are arranged in a first line and in a second line along a first direction (along a direction of AA' in FIG. 4), and the test leads are extended along a second direction (along a direction of BB' in FIG. 4), the test pads 104 in the first line and the test pads 104 in the second line are alternately arranged in the first direction and are staggered in the second direction, benefits of which lie in that more test pads 104 can be arranged for a specific length in the first direction, and with such arrangement the probe is not likely to touch other test pads 104 falsely when the probe is placed onto a test pad 104.

Figure 5:
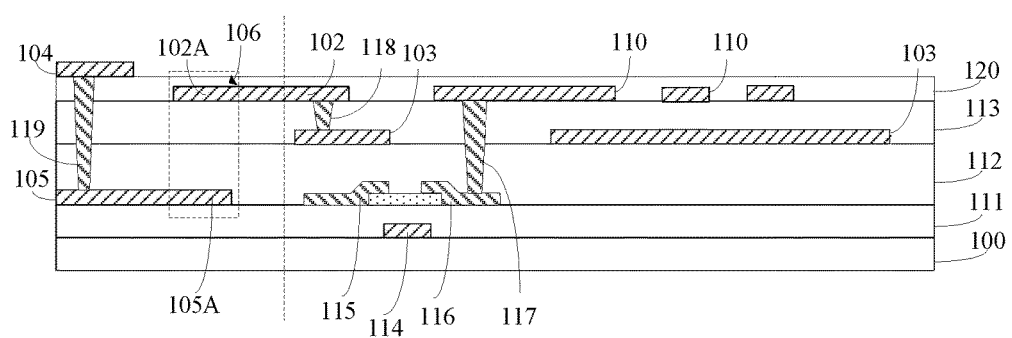
FIG. 5 is a sectional view of a region on the periphery of an array substrate according to another embodiment of the disclosure.

FIG. 5 is a sectional view of a region on the periphery of an array substrate according to another embodiment. Similar to FIG. 3, in FIG. 5, a sectional view of a region around the overlapping area 106 is shown on the left side of a dotted line, and a sectional view of a region around the common electrode 103 in the display region is shown on the right side of the dotted line. The array substrate in the embodiment is roughly the same as the array substrate shown in FIG. 3, the part of the array substrate according to the embodiment the same as that shown in FIG. 3 is not described herein, and the array substrate according to the embodiment differs from the array substrate shown in FIG. 3 in that, a fourth insulation layer 120 is further arranged on the pixel electrode 110, the test pad 104 is arranged on a side of the fourth insulation layer 120 farther away from the substrate 100, the fourth via hole 119 runs through the second insulation layer 112, the third insulation layer 113 and the fourth insulation layer 120, and the test pad 104 is electrically connected to the test lead 105 through the fourth via hole 119. In the embodiment, the test pad 104 is made of Indium Tin oxide, or other transparent metal oxide.

Figure 6:
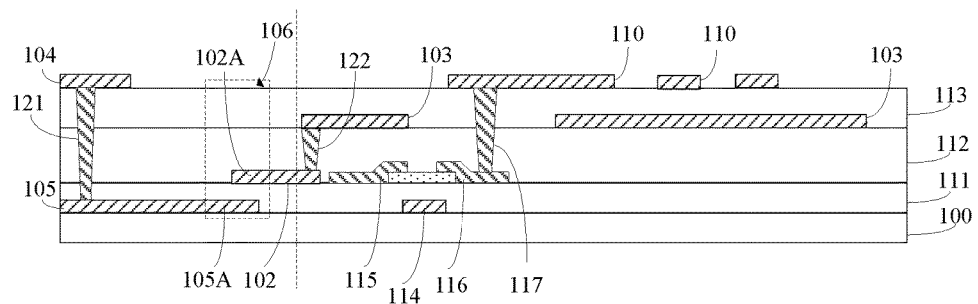
FIG. 6 is a sectional view of a region on the periphery of an array substrate according to another embodiment of the disclosure.

FIG. 6 is a sectional view of a region on the periphery of an array substrate according to another embodiment of the disclosure. Similar to FIG. 3, in FIG. 6, a sectional view of a region around the overlapping area 106 is shown on the left side of a dotted line, and a sectional view of a region around the common electrode 103 in the display region is shown on the right side of the dotted line. The array substrate in the embodiment is roughly the same as the array substrate shown in FIG. 3, the part of the array substrate according to the embodiment, the same as that shown in FIG. 3, is not described herein, and the array substrate according to the embodiment differs from the array substrate shown in FIG. 3 in that, the common electrode line 102 is arranged in the same layer with the source 115 and the drain 116, the test lead 105 is located in the same layer with the gate 114, the test pad 104 is located on the side of the third insulation layer 113 farther away from the substrate 100, the array substrate further includes a third via hole 121 located in the first insulation layer, and the second insulation layer and the third insulation layer, and the test pad 104 is electrically connected to the test lead 105 through the third via hole 121.

In another embodiment, the test lead 105 may alternatively be located in the same layer with the pixel electrode 110 or may alternatively be located in the same layer with the common electrode 103, in the case that the common electrode line 102 is located in the same layer with the source 115 and the drain 116.

In view of above, there may be one or more insulation layers between the test lead 105 and the common electrode line 102, and the one or more insulation layers can be easily burned through by using a laser device in a conventional laser repairing device, to electrically connect the test lead 105 to the common electrode line 102.

Figure 7:
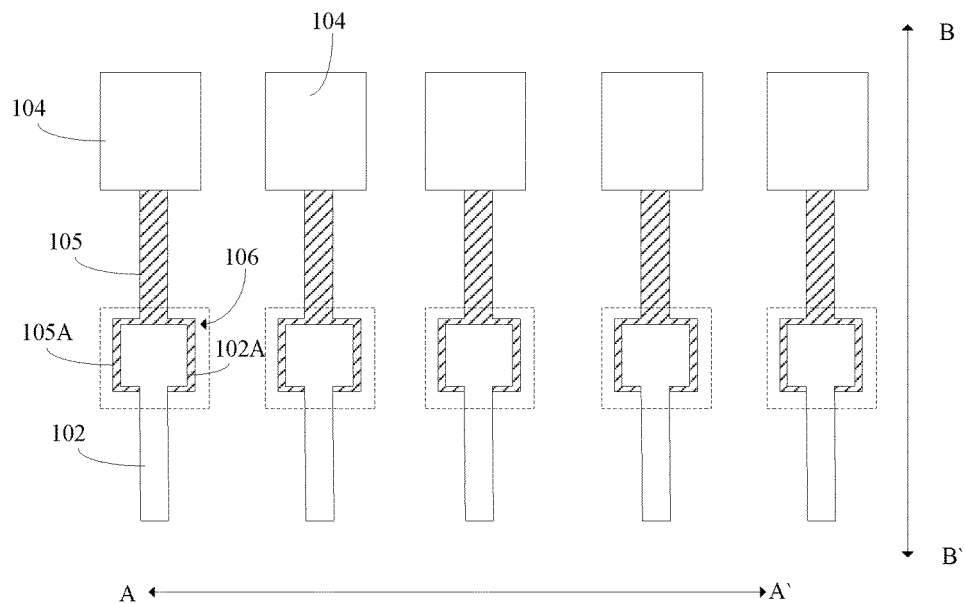
FIG. 7 is a distribution map of overlapping areas in an array substrate according to another embodiment of the disclosure.

FIG. 7 is a distribution map of overlapping areas in an array substrate according to another embodiment of the disclosure. The array substrate in the embodiment is roughly the same as the array substrate shown in FIG. 4, the part of the array substrate according to the embodiment, the same as the array substrate shown in FIG. 4, is not described herein, and the array substrate according to the embodiment differs from the array substrate shown in FIG. 4 in that, the multiple test pads 104 are arranged in a line in a first direction (namely a direction of AA' in FIG. 7), and the test leads 105 are extended in a second direction (namely a direction of BB' in FIG. 7). Benefits of such an arrangement lie in that the layout design is more convenient, and compared with the arrangement as shown in FIG. 4, the multiple test pads 104 and the test leads 105 occupy less space in the second direction, thereby reducing the size of the frame of the touch display apparatus in the case that the array substrate is applied to the touch display apparatus.

Figure 8:
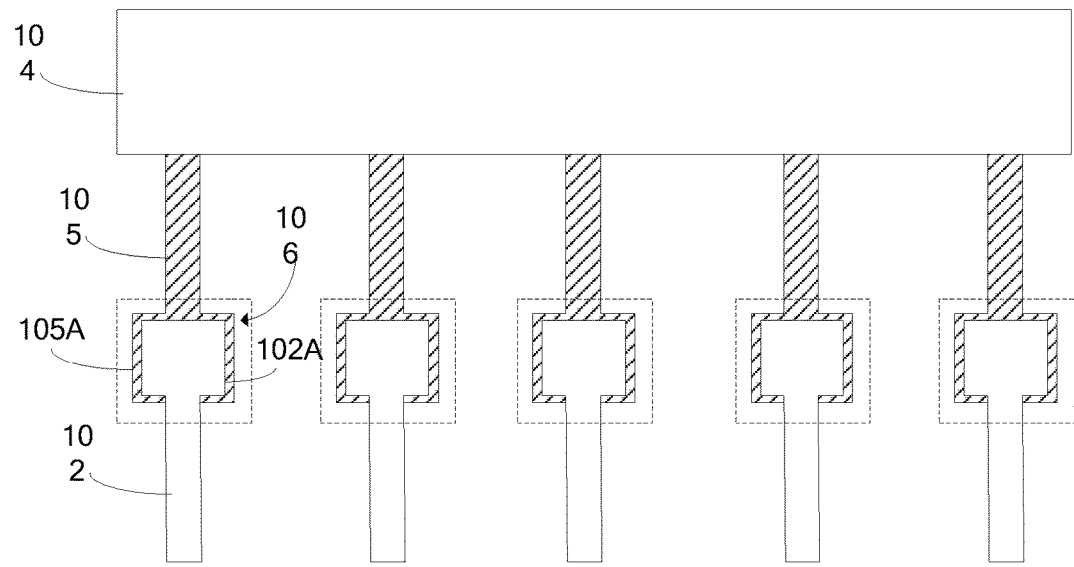
FIG. 8 is a distribution map of overlapping areas in an array substrate according to another embodiment of the disclosure.

FIG. 8 is a distribution map of overlapping areas in an array substrate according to another embodiment of the disclosure. The array substrate in this embodiment is roughly the same as the array substrate shown in FIG. 4, there are multiple overlapping areas 106 between the first extensions 105A and the second extensions 102A in the substrate, and each of the overlapping areas 106 corresponds to a respective common electrode 103. The part of the array substrate, the same as the array substrate shown in FIG. 4, is not described herein, and the array substrate according to the embodiment differs from the array substrate shown in FIG. 4 in that, the multiple test leads 105 are electrically connected to the same test pad 104. In the case that the potential of the common electrode needs to be tested, the laser melting is performed on the overlapping area 106 selectively as needed, to electrically connect the common electrode needing to be tested to the test pad 104. Benefits of such arrangement lie in that the test pad 104 is larger, and is beneficial for placing a probe.

It should be noted that, combined with FIG. 1 and FIG. 8, in the embodiment, the multiple test leads 105 are electrically connected to the same test pad 104, that is, one test pad 104 is shared by multiple common electrodes 103 to place the probe for testing the potentials of the multiple common electrodes 103. In the case that a potential of a common electrode 103 is tested, the laser melting is performed on the overlapping area 106 corresponding to the common electrode 103, to electrically connect the common electrode 103 to the test pad 104. In the case that a potential of another common electrode 103 needs to be tested, the test lead 105, which is melt in the last laser melting, is cut off by laser lights, to break the electric connection between the test lead 105 and the common electrode line 102. In this case, only the common electrode 103 to be tested is electrically connected to the test pad 104 when the potential of the another common electrode 103 is tested, and the potential of the common electrode 103 being tested by the test pad 104 may not be affected by other common electrodes 103 previously tested. The device used for the laser cutting may be an LCD laser repairing device.

Figure 9:
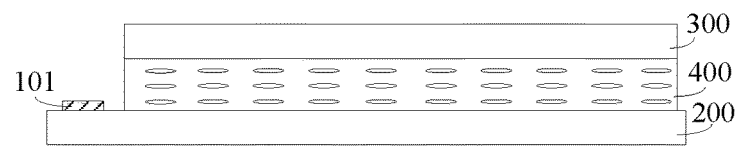
FIG. 9 is a schematic structural diagram of a touch display apparatus according to the disclosure.

A touch display apparatus is further provided according to the disclosure. FIG. 9 illustrates a schematic structural diagram of a touch display apparatus according to the disclosure. The touch display apparatus in the embodiment includes an array substrate according to the disclosure, where the array substrate 200 in the embodiment is any one of the array substrates as shown in FIG. 1 to FIG. 4 and the array substrate 200 is provided with a touch display chip 101; a color filter 300 arranged opposite to the array substrate 200; and a liquid crystal layer 400 arranged between the array substrate 200 and the color filter 300.

Common signals are input into the common electrode structure in a display period, and touch signals are input into or output from the common electrode structure in a touch period.

The array substrate 200 in the embodiment is any one of the array substrates as shown in FIG. 1 to FIG. 4. As shown in FIG. 1 to FIG. 4, in the case that the potential of the common electrode 103 needs to be tested by using a probe, the laser melting may be performed on the overlapping area 106, to electrically connect the test lead 105 to the common electrode line 102, thereby electrically connecting the conductive structure for testing to the common electrode structure. The probe is placed onto the test pad 104. Therefore, the difficulty of testing the potential of the common electrode 103 is reduced, and the probe is not likely to contact other components around the common electrode structure, thereby improving the accuracy of the test result. In the case that the touch display apparatus operates normally, the common electrode structure is insulated from the conductive structure for testing, and thus the potential of the common electrode structure is not susceptible to the conductive structure for testing. Especially, in the case that the test pad 104 is arranged on the surface of the touch display apparatus, the potential of the common electrode 103 is not affected even if a finger touches the test pad 104.

Accordingly, a test method for a touch display apparatus is provided according to the disclosure. The method can include providing a touch display apparatus, where the touch display apparatus includes the array substrate according to the disclosure. Optionally, the array substrate in the embodiment is any one of the array substrates as shown in FIG. 1 to FIG. 4. Therefore, as shown in FIG. 1 to FIG. 4, The test method for the touch display apparatus in the embodiment further includes performing laser melting on the overlapping area 106, to electrically connect the common electrode structure to the conductive structure for testing; and testing the potential of the conductive structure for testing to obtain the potential of the common electrode structure.

Figure 10:
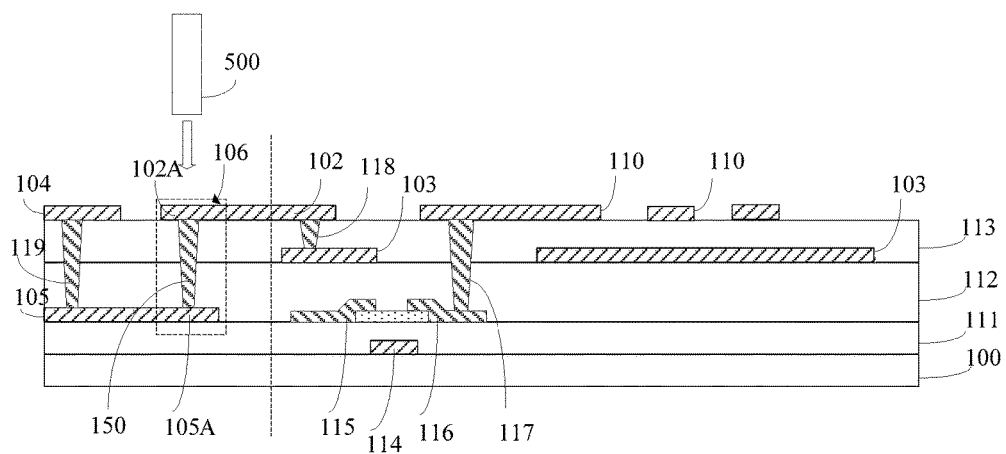
FIG. 10 is a schematic diagram of a test method for a touch display apparatus according to the disclosure.

FIG. 10 is a schematic diagram of a test method for a touch display apparatus according to an embodiment, and FIG. 10 is a schematic diagram of the process of performing laser melting on the array substrate as shown in FIG. 3. Therefore, the names of the components in FIG. 10 refer to FIG. 3, which are not described herein. As shown in FIG. 10, the process of performing laser melting on the overlapping area 106 includes: emitting laser lights on the overlapping area 106 by using a laser device 500. When the laser melting is performed on the overlapping area 106, the first extension portion 105A of the test lead 105 and the second extension portion 102A of the common electrode line 102 are melted, the second insulation layer 112 and the third insulation layer 113 between the first extension portion 105A and the second extension portion 102A are burned through, and a connection structure 150 running through the second insulation layer 112 and the third insulation layer 113 are formed between the first extension portion 105A and the second extension portion 102A, thereby electrically connecting the first extension portion 105A to the second extension portion 102A.

The process of testing the potential of the conductive structure for testing includes: placing a probe onto the test pad 104, testing the potential of the test pad 104, so that the potential of the common electrode 103 is obtained. The probe may be an oscilloscope probe or a probe of a manual prober in the flat panel display, which is not limited in the disclosure.

The probe is placed onto the test pad 104. Therefore, the difficulty of testing the potential of the common electrode 103 is reduced, and the probe is not likely to contact other components around the common electrode structure, thereby improving the accuracy of the test result. In the case that the touch display apparatus operates normally, the common electrode structure is insulated from the conductive structure for testing, and thus the potential of the common electrode structure is not susceptible to the conductive structure for testing. Especially, in the case that the test pad 104 is arranged on the surface of the touch display apparatus, the potential of the common electrode 103 is not affected even if a finger touches the test pad 104.

It should be noted that, in the embodiment, pulse energy of the laser device 500 ranges from 100 Uj/pulse to 1000 Uj/pulse, which is convenient to burn through multiple insulation layers, and is not limited in the disclosure.

It should further be noted that, in the embodiment, the laser device 500 is located in an LCD laser repairing device (not shown in FIG. 10), and the process of performing laser melting on the overlapping area 106 includes: placing the touch display apparatus in the LCD laser repairing device, benefits of which lie in that, the laser melting in the disclosure can be achieved by using the conventional LCD laser repairing device for repairing a point defect and a line defect, without additional device cost.

The embodiments are disclosed above, but the disclosure is not limited to the embodiments. Various changes and modifications may be made by those skilled in the art without departing from the spirit and the scope of the disclosure. Thus, the scope of the disclosure should be subject to the appended claims.

The invention claimed is:

1. An array substrate, comprising:
   a substrate; and
   a common electrode structure and a conductive structure for testing, the common electrode structure and the conductive being arranged on a same side of the substrate, wherein:
   the common electrode structure is insulated from the conductive structure for testing,
   there is an overlapping area between a projection of the common electrode structure and a projection of the conductive structure for testing in a direction perpendicular to the substrate such that performance of laser melting is facilitated on the overlapping area to electrically connect the common electrode structure to the conductive structure for testing,
   the common electrode structure comprises one or more common electrodes and one or more common electrode lines connected to the common electrodes,
   the conductive structure for testing comprises one or more test pads and one or more test leads connected to the test pads,
   the test pad is configured to place a test probe for testing the potential of the common electrode structure, and
   the overlapping area lies between a projection of the test lead and a projection of the common electrode line in the direction perpendicular to the substrate.

2. The array substrate according to claim 1, further comprising:
   a gate located on the substrate;
   a first insulation layer covering the gate;
   a source and a drain located on a side of the first insulation layer farther away from the substrate;
   a second insulation layer covering the source and the drain, wherein the common electrode is located on a side of the second insulation layer farther away from the substrate;
   a third insulation layer covering the common electrode;
   a pixel electrode located on a side of the third insulation layer farther away from the substrate; and
   a first via hole located in the second insulation layer and the third insulation layer, wherein the pixel electrode is electrically connected to the drain through the first via hole.

3. The array substrate according to claim 2, wherein
   the common electrode line is located in the same layer with the pixel electrode,
   the array substrate further comprises a second via hole located in the third insulation layer, and
   the common electrode is electrically connected to the common electrode line through the second via hole.

4. The array substrate according to claim 2, wherein
   the test lead is located in the same layer with the gate, the test pad is located on the side of the third insulation layer away from the substrate,
   the array substrate further comprises a third via hole located in the first insulation layer, the second insulation layer and the third insulation layer, and
   the test pad is electrically connected to the test lead through the third via hole.

5. The array substrate according to claim 2, wherein
   the test lead is located in the same layer with the source and the drain,
   the test pad is located on the side of the third insulation layer away from the substrate,
   the array substrate further comprises a fourth via hole located in the second insulation layer and the third insulation layer, and
   the test pad is electrically connected to the test lead through the fourth via hole.

6. The array substrate according to claim 1, wherein
   the array substrate is applied to a touch display apparatus,
   the common electrode structure comprises a plurality of common electrodes and a plurality of common electrode lines, each of the plurality of common electrodes being electrically connected to a respective common electrode line, and the common electrodes are configured to input common signals in a display period of the touch display apparatus, and input or output touch signals in a touch period of the touch display apparatus.

7. The array substrate according to claim 1, further comprising a display region, wherein the common electrode is located in the display region and the overlapping area is located on the periphery of the display region.

8. The array substrate according to claim 7, wherein a touch display chip is arranged on a side of the display region of the array substrate, and the overlapping area is located on the array substrate on a side away from the touch display chip.

9. The array substrate according to claim 1, wherein
the conductive structure for testing comprises a plurality of test leads, each of the test leads comprising a first extension portion,
the common electrode line comprises a second extension portion,
the first extension portion is arranged opposite to the second extension portion,
the overlapping area lies between a projection of the first extension portion of the test lead and a projection of the second extension portion of the common electrode line in the direction perpendicular to the substrate,
the first extension portion is arranged on an end of the test lead, and
the second extension portion is arranged on an end of the common electrode line.

10. The array substrate according to claim 1, wherein the conductive structure for testing comprises a plurality of test pads, and each test pad is electrically connected to a respective test lead.

11. The array substrate according to claim 10, wherein the plurality of test pads are arranged in a line in a first direction, and the test leads are extended in a second direction.

12. The array substrate according to claim 11, wherein the plurality of test pads are arranged in a first line and in a second line along a first direction, and the test leads are extended along a second direction, wherein the test pads in the first line and the test pads in the second line are alternately arranged in the first direction and are staggered in the second direction.

13. The array substrate according to claim 1, wherein a plurality of the test leads are electrically connected to a same test pad.

14. A touch display apparatus, comprising:
an array substrate, comprising:
a substrate; and
a common electrode structure and a conductive structure for testing, the common electrode structure and the conductive being arranged on a same side of the substrate, wherein the common electrode structure is insulated from the conductive structure for testing,
wherein there is an overlapping area between a projection of the common electrode structure and a projection of the conductive structure for testing in a direction perpendicular to the substrate such that performance of laser melting is facilitated on the overlapping area to electrically connect the common electrode structure to the conductive structure for testing;
a color filter arranged opposite to the array substrate; and
a liquid crystal layer arranged between the array substrate and the color filter, wherein:

the common electrode structure comprises one or more common electrodes and one or more common electrode lines connected to the common electrodes,
the conductive structure for testing comprises one or more test pads and one or more test leads connected to the test pads,
the test pad is configured to place a test probe for testing the potential of the common electrode structure, and
the overlapping area lies between a projection of the test lead and a projection of the common electrode line in the direction perpendicular to the substrate.

15. The touch display apparatus according to claim 14, wherein the common electrode structure is configured to input common signals in a display period, and input or output touch signals in a touch period.

16. A test method for a touch display apparatus, comprising:
providing a touch display apparatus, wherein the touch display apparatus comprises
an array substrate, comprising:
a substrate; and
a common electrode structure and a conductive structure for testing, the common electrode structure and the conductive being arranged on a same side of the substrate, wherein the common electrode structure is insulated from the conductive structure for testing,
wherein there is an overlapping area between a projection of the common electrode structure and a projection of the conductive structure for testing in a direction perpendicular to the substrate such that performance of laser melting is facilitated on the overlapping area to electrically connect the common electrode structure to the conductive structure for testing;
performing laser melting on the overlapping area, to electrically connect the common electrode structure to the conductive structure for testing; and
testing the potential of the conductive structure for testing to obtain a potential of the common electrode structure, wherein:
the common electrode structure comprises one or more common electrodes and one or more common electrode lines connected to the common electrodes,
the conductive structure for testing comprises one or more test pads and one or more test leads connected to the test pads,
the test pad is configured to place a test probe for testing the potential of the common electrode structure, and
the overlapping area lies between a projection of the test lead and a projection of the common electrode line in the direction perpendicular to the substrate.

17. The test method according to claim 16, wherein
the process of performing laser melting on the overlapping area comprises: emitting laser lights on the overlapping area by using a laser device; and
the process of testing a potential of the conductive structure for testing comprises: placing a probe onto the test pad.

18. The test method according to claim 17, wherein pulse energy of the laser device ranges from 100 Uj/pulse to 1000 Uj/pulse.

19. The test method according to claim 18, wherein the laser device is arranged in an LCD laser repairing device, and the process of performing laser melting on the overlapping area comprises: placing the touch display apparatus in the LCD laser repairing device.

* * * * *